United States Patent
Boisvert et al.

(10) Patent No.: US 7,592,651 B2
(45) Date of Patent: Sep. 22, 2009

(54) LOW DARK CURRENT PHOTODIODE FOR IMAGING

(75) Inventors: Joseph C. Boisvert, Thousand Oaks, CA (US); Rengarajan Sudharsanan, Stevenson Ranch, CA (US)

(73) Assignee: The Boeing Company, Chicago, IL (US)

( * ) Notice: Subject to any disclaimer, the term of this patent is extended or adjusted under 35 U.S.C. 154(b) by 508 days.

(21) Appl. No.: 11/297,009

(22) Filed: Dec. 8, 2005

(65) Prior Publication Data

US 2007/0131977 A1 Jun. 14, 2007

(51) Int. Cl.
 *H01L 27/148* (2006.01)
(52) U.S. Cl. .................. 257/232; 257/184; 257/257; 257/432; 257/E31.058
(58) Field of Classification Search .......... 257/184, 257/186, 189, 258, 438, 233, 436, 461, 464, 257/466, 231, 232, 257, 290, 432
See application file for complete search history.

(56) References Cited

U.S. PATENT DOCUMENTS 5,288,989 A * 2/1994 Ishaque et al. ........... 250/214.1
5,656,831 A * 8/1997 Kusakabe ................. 257/186
2004/0100194 A1* 5/2004 Eden et al. ................ 313/538
2004/0251483 A1* 12/2004 Ko et al. ................... 257/292
2005/0263888 A1* 12/2005 Jiang et al. ................ 257/738

OTHER PUBLICATIONS

S.M. Sze Physics of Semiconductor Devices 2nd ed. John Wiley and Sons 1981. Specifically Ch. 13 pp. 743-789.

* cited by examiner

*Primary Examiner*—Wai-Sing Louie
(74) *Attorney, Agent, or Firm*—Weiss & Moy, P.C.

(57) ABSTRACT

A photodiode and method of forming a photodiode has a substrate. An absorption layer is formed on the substrate to absorb lightwaves of a desired frequency range. A multiplication structure is formed on the absorption layer. The multiplication layer uses a low dark current avalanching material. The absorption layer and the multiplication layer are formed into at least one mesa having in an inverted "T" configuration to reduce junction area between the absorption layer and the multiplication layer. A dielectric layer is formed over the at least one mesa. At least one contact is formed on the dielectric layer and coupled to the at least one mesa.

25 Claims, 2 Drawing Sheets

LOW DARK CURRENT PHOTODIODE FOR IMAGING

BACKGROUND OF THE INVENTION

1. Field of the Invention

The present invention relates generally to imaging arrays, and more particularly, to a photodetector that can operate at room temperature, with first stage amplification, and which will minimize dark current generation and capacitance per unit optical area.

2. Background Information

In solid state photodetectors, photons are converted to electrons and the electron signal is subsequently amplified for further use. Current state of the art amplifying electronics require that the photodetector provide first stage amplification in order to overcome downstream amplifier noise in high bandwidth systems. Avalanche photodiodes (APDs) can provide first stage amplification gain. However, the signal to noise ratio in present APDs is too small. Current ADPs suffer from too much dark current generation and too much capacitance per unit optical area to be used in room temperature photon counting imagers. Both dark current and APD capacitance contribute to the overall noise floor of the photodiode.

Photon counting imaging arrays using P—I—N photodiodes without amplification operate with relatively long integration times. This operation places a premium on minimizing detector dark current. It is anticipated that the total dark current per pixel will need to be <0.2 fA at room temperature in order to meet noise requirements.

Present SWIR P—I—N photodiodes have been demonstrated with dark currents that are roughly six orders of magnitude higher than this requirement. Thus, minimizing the dark current and photodiode capacitance is necessary to reach levels that will result in single photon counting.

Therefore, it would be desirable to provide a photodiode that overcomes the above problems. The photodiode must be able to minimize both the dark current and the capacitance in order to reduce overall noise.

SUMMARY OF THE INVENTION

A photodiode and method of forming a photodiode has a substrate. An absorption layer is formed on the substrate to absorb lightwaves of a desired frequency range. A multiplication structure is formed on the absorption layer. The multiplication layer uses a low dark current avalanching material. The absorption layer and the multiplication layer are formed into at least one mesa having in an inverted "T" configuration to reduce junction area between the absorption layer and the multiplication layer. A dielectric layer is formed over the at least one mesa. At least one contact is formed on the dielectric layer and coupled to the at least one mesa.

A photodiode and method of forming a photodiode has a substrate. A dark current blocking layer is formed on the substrate. An absorption layer is formed on the substrate to absorb lightwaves of a desired frequency range. A multi-layer configuration is formed on the absorption layer having an n-doped layer, an intrinsic undoped layer, and a p-doped layer. The absorption layer and the multi-layer configuration is formed into at least one mesa having in an inverted "T" configuration to reduce junction area between the absorption layer and the multi-layer configuration. A dielectric layer is formed over the at least one mesa. At least one contact is formed on the dielectric layer and coupled to the at least one mesa.

The features, functions, and advantages can be achieved independently in various embodiments of the present inventions or may be combined in yet other embodiments.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
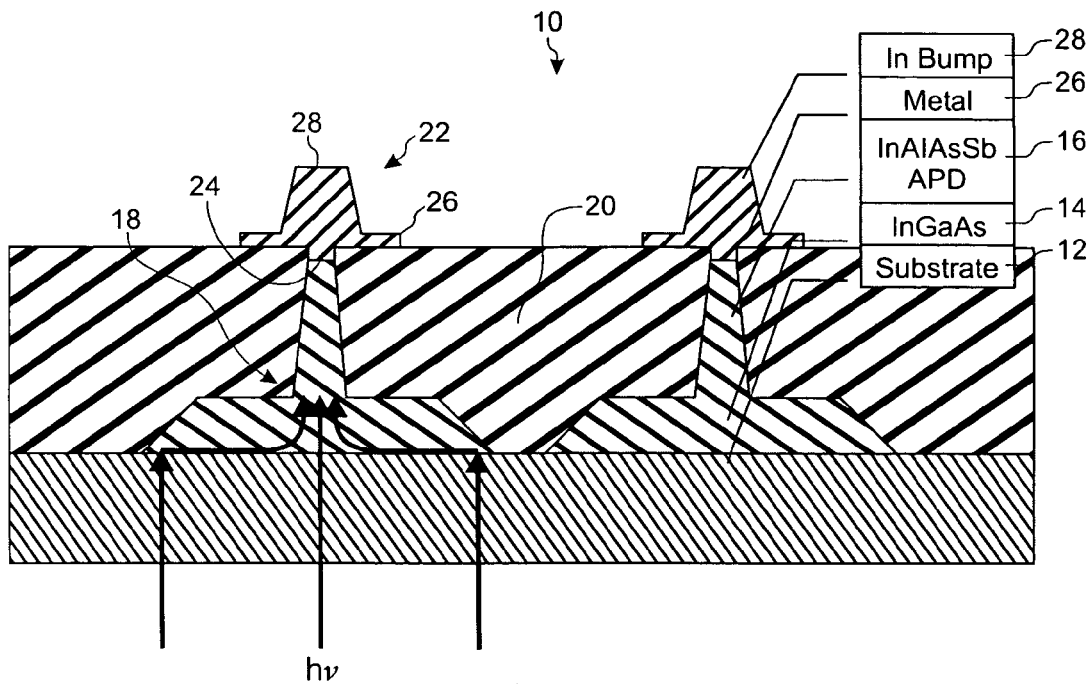
FIG. 1 is a cross sectional view illustrating a first advantageous embodiment of the photodiode of the present invention.

With reference now to the Figures, and in particular with reference to FIG. 1, a photodiode 10 is illustrated. The photodiode 10 has a base or substrate layer 12. The substrate layer 12 is made of material which is transparent to light waves. Thus, the substrate 12 is made from a material which will allow light waves to pass through the substrate 12. In accordance with one embodiment of the present invention, it is desirable that the substrate 12 allows short wave length infra-red light waves to pass through. A material such as Indium Phosphate (InP) may be used for the substrate 12. InP is widely used in photodetectors in lightwave communication systems because of its advantageous transport properties.

A second layer 14 is formed on the substrate 12. The second layer 14 is used to absorb the lightwaves of interest. Different materials may be used based on the desired wavelength of the lightwaves which are to be absorbed. In accordance with one embodiment of the present invention, it is desirable for the second layer 14 to absorb short wave length infra-red light waves. Indium Gallium Arsenic (InGaAs) detector material will absorb lightwaves in the infrared to ultraviolet frequencies depending on the processing techniques. InGaAs detector material will absorbed the lightwaves and diffuse to the collecting depletion width in less than 100 ns. An undepleted InGaAs absorption layer further does not contribute to dark current generation at room temperature. Thus, an undepleted InGaAs absorption layer as the second layer 14 will allow the photodiode 10 to operate at room temperature while minimizing dark current generation.

A third structure 16 is formed on the second layer 14. The third structure 16 acts as a multiplication region for the photodiode 10. This structure may be formed in various ways with is several layers as is well known in the art. Present across the second layer 14 or the absorption layer is an electric field that serves to separate the photo-generated holes and electrons, and sweeps one carrier towards the third structure 16 or the multiplication region. The third structure 16 is designed to exhibit a high electric field to provide internal photo-current gain by impact ionization. Thus, the one carrier that enters the third structure 16 will multiply into a plurality of carriers exiting the structure 16.

In order to reduce the dark current generation in the photodiode 10, the third structure 16 uses a low dark current avalanching material. Present Indium Aluminum Arsenic (In-AlAs) APDs have a dark current floor that is limited by trap-assisted tunneling in the InAlAs. Using a wider bandgap semiconductor that is lattice matched to InP is expected to reduce the dark current by another four orders of magnitude. Lattice matched InAlAsSb is also an indirect material (like silicon) that holds the promise of realizing lower excess noise than is presently available in III-V multiplication layers. In general, forming InAlAs APDs would consist of an epitaxial layer growth structure.

Once the third structure 16 is applied, one or more mesas 18 are formed. Each mesa 18 will have a funnel or inverted "T" configuration. The funnel or inverted "T" configuration will reduce the junction area between the different layers. The dark current is proportional to the junction area. Thus, the reduced junction area will reduce junction capacitance and generation of dark current thereby reducing the overall noise floor of the photodiode 10. The reduced junction area is very important in uses where the photodiode 10 may be cooled to below ambient temperatures. Many infrared camera systems include thermo-electric or other cryogenic cooling systems to reduce dark current. Semiconductor dark current are a strong function of temperature and a decrease in even 40° C. can result in reduction of 100× in dark current which corresponds to a reduction of 10× in noise. A consequence of this is that as the temperature is reduced, the dark current generated in the junction area becomes dominant and hence limits the ultimate signal-to-noise that can be achieved with a cooled system.

Each mesa 18 is defined one at a time. The mesas 18 may be formed in different manners. In accordance with one embodiment of the present invention, each mesa 18 is formed using a photolithography process. Photolithography is used because it affords exact control over the shape and size of the objects it creates. Once the layers 14 and 16 are formed on the substrate 12, a photoresist layer is applied. A photomask or shadowmask is used together an illumination source to harden the photoresist in specific places. The exposed semiconductor material is then etched using different chemical treatments until all that remains are the metal layers 14 and 16 in the shape of the mesa 18.

Once the mesas 18 are formed, a dielectric layer 20 is applied over the mesas 18. Any type of dielectric material may be used. In accordance with one embodiment of the present invention, the dielectric layer 20 uses a low-κ dielectric material. A low-κ dielectric material as the dielectric layer 20 will minimizes MIS capacitance between the cathode metal and the InGaAs metal of the second layer 14. The low-κ dielectric may be a polyimide or other type of photodefinable dielectric. The listing of the above is given as examples and should not be seen as to limit the scope of the present invention.

In order to read the signals from the photodiode 10 an output terminal 22 need to be coupled to the third layer 16. In the embodiment depicted in FIG. 1, a metal bump 28 is used as the output terminal 22. The metal bump 28 may be formed of different types of conductive metals. In accordance with one embodiment of the present invention, the metal bump 28 is formed on indium (In).

Since the dielectric layer 20 has been placed over the mesas 18, an opening 24 is formed in the dielectric layer 20 to expose the third layer 16. In accordance with one embodiment of the present invention, the opening 24 is formed using a photolithography process and a photoactive polyimide dielectric layer that is selectively removed using a photomask process. Since the opening 24 in the dielectric layer 20 is too small to accommodate the output terminal 22, a metal layer 26 is applied on the surface of the dielectric layer 20. The metal layer 26 is applied on the surface of the dielectric layer 20 so that the metal layer 26 covers and fills in the opening 24. The metal layer 26 is in contact with the expose third layer 16 to form a conductive surface for the output terminal 22. The metal layer 26 may be any type of conductive metal. For example, the metal layer may be gold, aluminum, titanium, or the like. The listing of the above is given as examples and should not be seen as to limit the scope of the present invention. A metal bump 28 is then formed on the metal layer 26.

Figure 2:
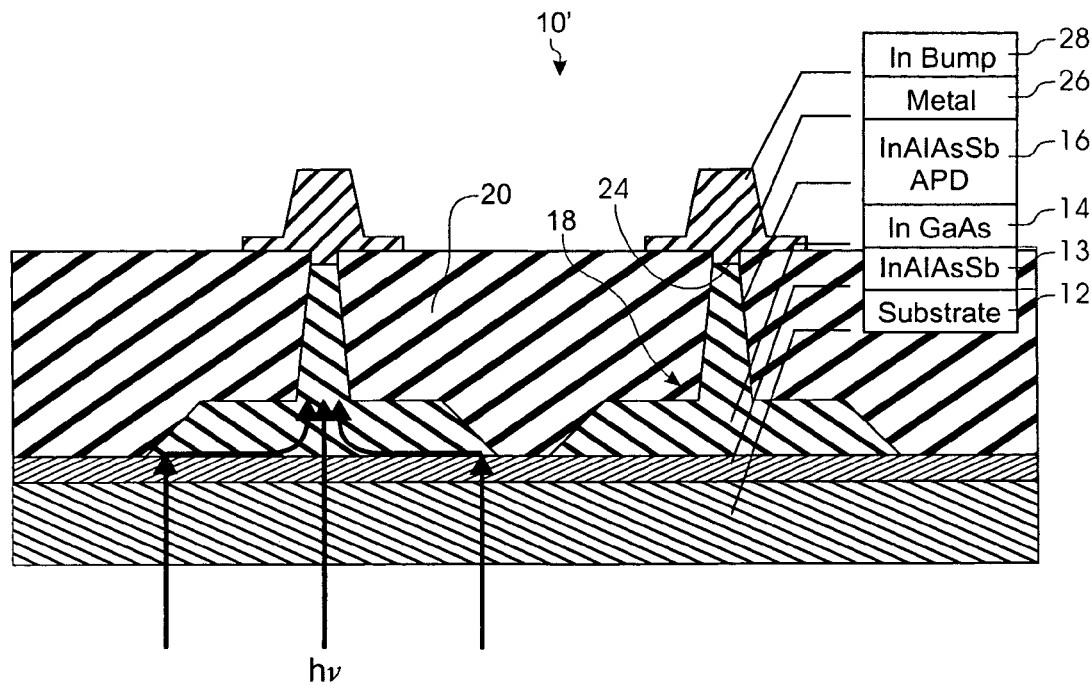
FIG. 2 is a cross sectional view illustrating a second advantageous embodiment of the photodiode of the present invention.

Referring to FIG. 2, another embodiment of the photodiode 10' is shown. The photodiode 10' is similar to the photodiode 10 shown in FIG. 1. The main difference is that a dark current blocking layer 13 is formed on the substrate 12. To further reduce dark current, a wide bandgap material can be used as the blocking layer 13 that will reduce dark current in an InGaAs photodiode. Wide bandgap materials lattice matched to InGaAs layers such as InP, InAlAs, and Indium Aluminum Arsenic Antimony (InAlAsSb) are wide bandgap material that may be formed on the substrate 12.

The photodiode 10 in FIGS. 1 and 2 are avalanche photodiodes (APDs). APDs are typically employed in very high frequency systems (>100 MHz) because of the limiting component in those applications is an electronic amplifier which gets very noisy at high frequencies. APDs are used in active ranging applications like laser range finding where a laser illuminates a target and the reflected light is incident on the avalanche photodiode array. In all photodiodes, the system sensitivity or signal to noise ratio is a key performance parameter. In APDs, the noise is a function of dark current and device capacitance. The combinations of different metals in the second and third layers 14 and 16, plus the funnel or inverted "T" configuration of the mesas 18 to reduce junction area, will minimize dark current generation and capacitance per unit optical area for the photodiode 10.

Figure 3:
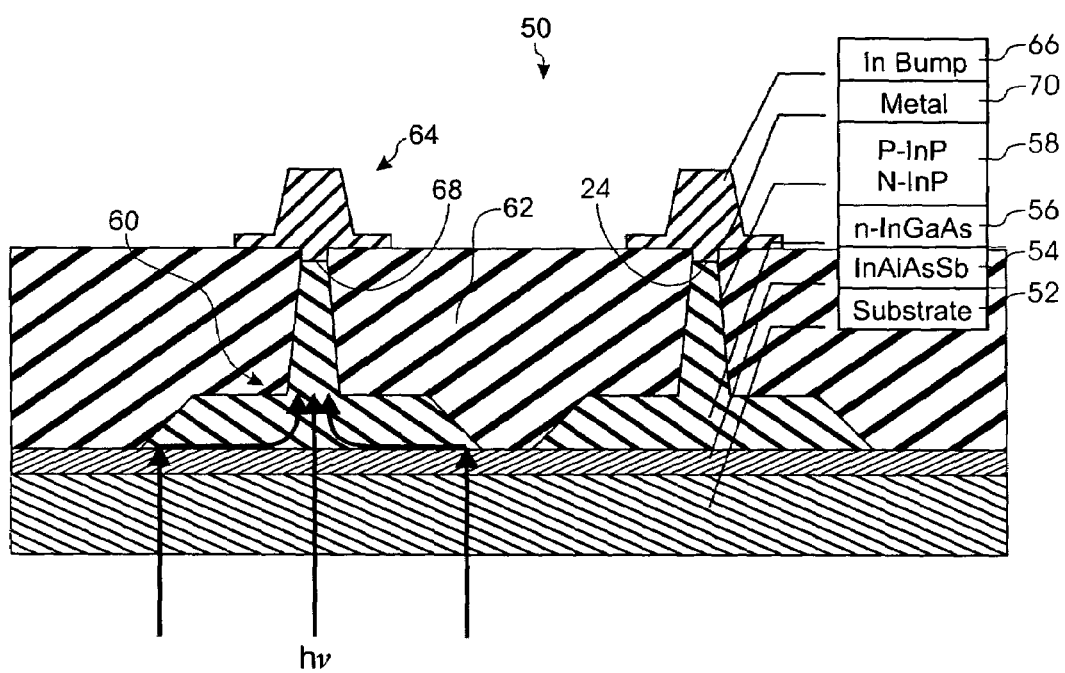
FIG. 3 is a cross sectional view illustrating another advantageous embodiment of the photodiode of the present invention.

Referring now to FIG. 3, another embodiment of the photodiode 50 is illustrated. The photodiode 50 is a Positive Intrinsic Negative (PIN) photodiode detector. The photodiode 50 has a base or substrate layer 52. The substrate layer 52 is made of material which is transparent to light waves. Thus, the substrate 52 is made from a material which will allow light waves to pass through the substrate 52. In accordance with one embodiment of the present invention, it is desirable that the substrate 52 allows short wave length infrared light waves to pass through. A material such as Indium Phosphorus (InP) may be used for the substrate 52. InP is widely used in photodetectors in lightwave communication systems because of its advantageous transport properties.

A second layer 54 is formed on the substrate 52. The second layer 54 is used to suppress dark current and thus the noise in the photodiode 50. A wide bandgap material can be used as a blocking layer that will reduce dark current in an InGaAs photodiode. Wide bandgap materials lattice matched to InGaAs layers such as InP, InAlAs, and Indium Aluminum Arsenic Antimony (InAlAsSb) are wide bandgap material that may be used second layer 54.

A third layer 56 is used to absorb the lightwaves of interest. Different materials may be used based on the desired wavelength of the lightwaves which are to be absorbed. In accordance with one embodiment of the present invention, it is desirable for the third layer 56 to absorb short wave length infra-red light waves. Indium Gallium Arsenic (InGaAs) detector material will absorb lightwaves in the infrared to ultraviolet frequencies depending on the processing techniques. InGaAs detector material will absorbed the lightwaves and diffuse to the collecting depletion width in less than 100 ns. The third layer 56 is generally lightly-doped or an intrinsic material. An undepleted InGaAs absorption layer further does not contribute to dark current generation at room temperature. Thus, an undepleted InGaAs absorption layer as the third layer 56 will allow the photodiode 50 to operate at room temperature while minimizing dark current generation.

In a PIN photodiode detector, the photodiode will have an intrinsic undoped region in between the n-doped and p-doped regions. Thus, a multi-layer configuration 58 is formed on the third layer 56. The multi-layer configuration 58 has an n-type layer, an intrinsic undoped layer, and a p-type layer. In the embodiment depicted in FIG. 3, the multi-layer configuration has an n-doped InP layer, a wide bandgap intrinsic InP layer, and a p-doped InP layer.

Once the multi-layer configuration 58 is applied, one or more mesas 60 are formed. Each mesa 60 will have a funnel or inverted "T" configuration. The funnel or inverted "T" configuration will reduce the junction area between the different layers. The dark current is proportional to the junction area. Thus, the reduced junction area will reduce generation of dark current thereby reducing the overall noise floor of the photodiode 50. The reduced junction area is very important in uses where the photodiode 10 may be cooled to below ambient temperatures. Many infrared camera systems include thermo-electric or other cryogenic cooling systems to reduce dark current. Semiconductor dark current are a strong function of temperature and a decrease in even 40° C. can result in reduction of 100× in dark current which corresponds to a reduction of 10× in noise. A consequence of this is that as the temperature is reduced, the dark current generated in the junction area becomes dominant and hence limits the ultimate signal-to-noise that can be achieved with a cooled system.

Each mesa 60 is defined one at a time. The mesas 60 may be formed in different manners. In accordance with one embodiment of the present invention, each mesa 60 is formed using a photolithography process. Photolithography is used because it affords exact control over the shape and size of the objects it creates. Once the layers 56 and 58 are formed on the substrate 52, a photoresist layer is applied. A photomask or shadowmask is used together an illumination source to harden the photoresist in specific places. The exposed semiconductor material is then etched using different chemical treatments until all that remains are the layers 56 and 58 in the shape of the mesa 60.

Once the mesas 60 are formed, a dielectric layer 62 is applied over the mesas 60. Any type of dielectric material may be used. In accordance with one embodiment of the present invention, the dielectric layer 62 uses a low-κ dielectric material. A low-κ dielectric material as the dielectric layer 62 will minimizes MIS capacitance between the cathode metal and the InGaAs metal of the third layer 56. The low-κ dielectric may be a polyimide or other type of photodefinable dielectric. The listing of the above is given as examples and should not be seen as to limit the scope of the present invention.

In order to read the signals from the photodiode 50 an output terminal 64 is provided. The output terminal 64 needs to be coupled to the multi-layer configuration 58. In the embodiment depicted in FIG. 3, a metal bump 66 is used as the output terminal 64. The metal bump 66 may be formed of different types of conductive metals. In accordance with one embodiment of the present invention, the metal bump 66 is formed on indium (In).

Since the dielectric layer 62 has been placed over the mesas 60, an opening 68 is formed in the dielectric layer 62 to expose the multi-layer configuration 58. In accordance with one embodiment of the present invention, the opening 68 is formed using a photolithography process and a photoactive polyimide dielectric. Since the exposed section of the multi-layer 58 is too small to accommodate the output terminal 64, a metal layer 70 is applied on the surface of the dielectric layer 62. The metal layer 70 is applied on the surface of the dielectric layer 62 so that the metal layer 70 covers and fills in the opening 68. The metal layer 70 is in contact with the expose multi-layer 58 to form a conductive surface for the output terminal 64. The metal layer 70 may be any type of conductive metal. Foe example, the metal layer may be gold, aluminum, titanium, or the like. The listing of the above is given as examples and should not be seen as to limit the scope of the present invention. The metal bump 66 is then formed on the metal layer 70.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A photodiode comprising:
a substrate;
an absorption layer formed on the substrate to absorb lightwaves of a desired frequency range;
a multi-layer configuration formed on the absorption layer having an n-doped layer, an intrinsic undoped layer, and a p-doped layer, the absorption layer and the multi-layer configuration formed into at least one mesa having an inverted "T" configuration to reduce junction area between the absorption layer and the multi-layer configuration;
a dielectric layer formed over the at least one mesa; and
at least one contact formed on the dielectric layer and coupled to the at least one mesa.

2. A photodiode in accordance with claim 1 wherein the substrate comprises Indium Phosphate (InP).

3. A photodiode in accordance with claim 1 wherein the absorption layer absorbs infra-red light waves.

4. A photodiode in accordance with claim 3 wherein the absorption layer comprises Indium Gallium Arsenic (InGaAs).

5. A photodiode in accordance with claim 1 wherein the multiplication layer comprises Indium Aluminum Arsenic (InAlAs).

6. A photodiode in accordance with claim 1 wherein the dielectric layer comprises a low-κ dielectric material.

7. A photodiode in accordance with claim 6 wherein the low-κ dielectric material is a polyimide.

8. A photodiode in accordance with claim 6 wherein the low-κ dielectric material is a photodefinable dielectric.

9. A photodiode in accordance with claim 1 further comprising at least one opening formed in the dielectric layer to expose the at least one mesa.

10. A photodiode in accordance with claim 9 wherein the at least one contact comprises:
a metal layer formed on the dielectric layer, the metal layer in contact with the exposed mesa; and
a metal bump formed on the metal layer.

11. A photodiode in accordance with claim 10 wherein the metal bump comprises Indium.

12. A photodiode in accordance with claim 1 further comprising a dark current blocking layer formed between the substrate and the absorption layer.

13. A photodiode in accordance with claim 12 wherein the dark current blocking layer comprises a wide bandgap materials lattice matched to the absorption layer.

14. A photodiode in accordance with claim 12 wherein the wide bandgap materials lattice matched to the absorption layer is selected from the group comprising: InP, InAlAs, and InAlAsSb.

15. A photodiode comprising:

a substrate;

a dark current blocking layer formed on the substrate;

an absorption layer formed on the substrate to absorb lightwaves of a desired frequency range;

a multi-layer configuration formed on the absorption layer having an n-doped layer, an intrinsic undoped layer, and a p-doped layer, the absorption layer and the multi-layer configuration formed into at least one mesa having an inverted "T" configuration to reduce junction area between the absorption layer and the multi-layer configuration;

a dielectric layer formed over the at least one mesa; and at least one contact formed on the dielectric layer and coupled to the at least one mesa.

16. A photodiode in accordance with claim 15 wherein the substrate comprises Indium Phosphate (InP).

17. A photodiode in accordance with claim 15 wherein the absorption layer comprises Indium Gallium Arsenic (InGaAs).

18. A photodiode in accordance with claim 15 wherein the dark current blocking layer comprises a wide bandgap materials lattice matched to the absorption layer.

19. A photodiode in accordance with claim 18 wherein the wide bandgap materials lattice matched to the absorption layer is selected from the group comprising: InP, InAlAs, and InAlAsSb.

20. A photodiode in accordance with claim 15 wherein the multi-layer configuration formed on the absorption layer having an n-doped layer, an intrinsic undoped layer, and a p-doped layer comprises an n-doped InP layer, a wide bandgap intrinsic InP layer, and a p-doped InP layer.

21. A photodiode in accordance with claim 15 wherein the dielectric layer comprises a low-κ dielectric material.

22. A photodiode in accordance with claim 15 wherein the low-κ dielectric material is a polyimide.

23. A photodiode in accordance with claim 15 wherein the low-κ dielectric material is a photodefinable dielectric.

24. A photodiode in accordance with claim 15 wherein the at least one contact comprises:

a metal layer formed on the dielectric layer, the metal layer in contact with the mesa; and a metal bump formed on the metal layer.

25. A photodiode in accordance with claim 24 wherein the metal bump comprises Indium.

* * * * *

UNITED STATES PATENT AND TRADEMARK OFFICE
CERTIFICATE OF CORRECTION

PATENT NO. : 7,592,651 B2
APPLICATION NO. : 11/297009
DATED : September 22, 2009
INVENTOR(S) : Boisvert et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 729 days.

Signed and Sealed this

Twenty-first Day of September, 2010

David J. Kappos
*Director of the United States Patent and Trademark Office*